(12) United States Patent
Nomaguchi

(10) Patent No.: US 8,610,148 B2
(45) Date of Patent: Dec. 17, 2013

(54) OPTICAL MODULE INSTALLING OPTICAL DEVICE WITH IDENTIFYING MARK VISUALLY INSPECTED AFTER ASSEMBLY THEREOF

(75) Inventor: Toshio Nomaguchi, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 440 days.

(21) Appl. No.: 12/892,999

(22) Filed: Sep. 29, 2010

(65) Prior Publication Data

US 2011/0079809 A1    Apr. 7, 2011

(30) Foreign Application Priority Data

Oct. 1, 2009    (JP) .................................. 2009-229892

(51) Int. Cl.
*H01L 33/00*    (2010.01)
*H01S 5/02*    (2006.01)

(52) U.S. Cl.
USPC ........................ 257/98; 372/43.01; 372/49.01

(58) Field of Classification Search
None
See application file for complete search history.

(56) References Cited

U.S. PATENT DOCUMENTS

| | | | | |
|---|---|---|---|---|
| 6,577,656 | B2 * | 6/2003 | Chen et al. | 372/36 |
| 6,985,505 | B2 * | 1/2006 | Nomoto et al. | 372/49.01 |
| 7,724,793 | B2 * | 5/2010 | Kawakami et al. | 372/43.01 |
| 7,924,897 | B2 * | 4/2011 | Ohno | 372/49.01 |

FOREIGN PATENT DOCUMENTS

WO    00/57458    9/2000

* cited by examiner

*Primary Examiner* — Calvin Lee
*Assistant Examiner* — Scott Stowe
(74) *Attorney, Agent, or Firm* — Smith, Gambrell & Russell, LLP

(57) ABSTRACT

An optical module is described, where the optical module installs an optical device whose identification mark is able to be distinguished even after the optical device is installed in the optical module. The identifying mark of the optical device is formed in a position able to be inspected from the direction of the normal line of the light-emitting facet of the optical device. Accordingly, the identifying mark becomes able to be identified through the lens after the optical device is installed in the package of the optical module.

10 Claims, 17 Drawing Sheets

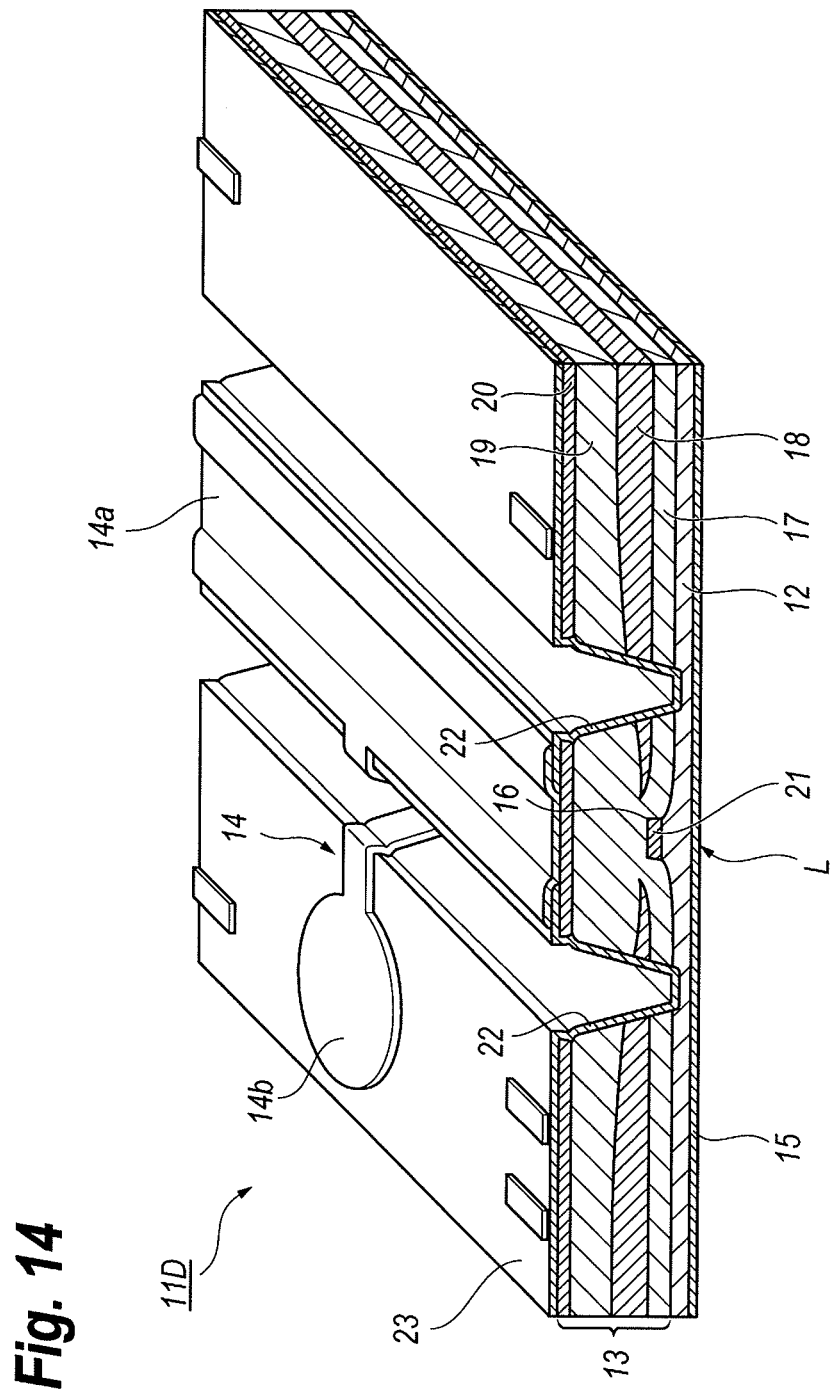

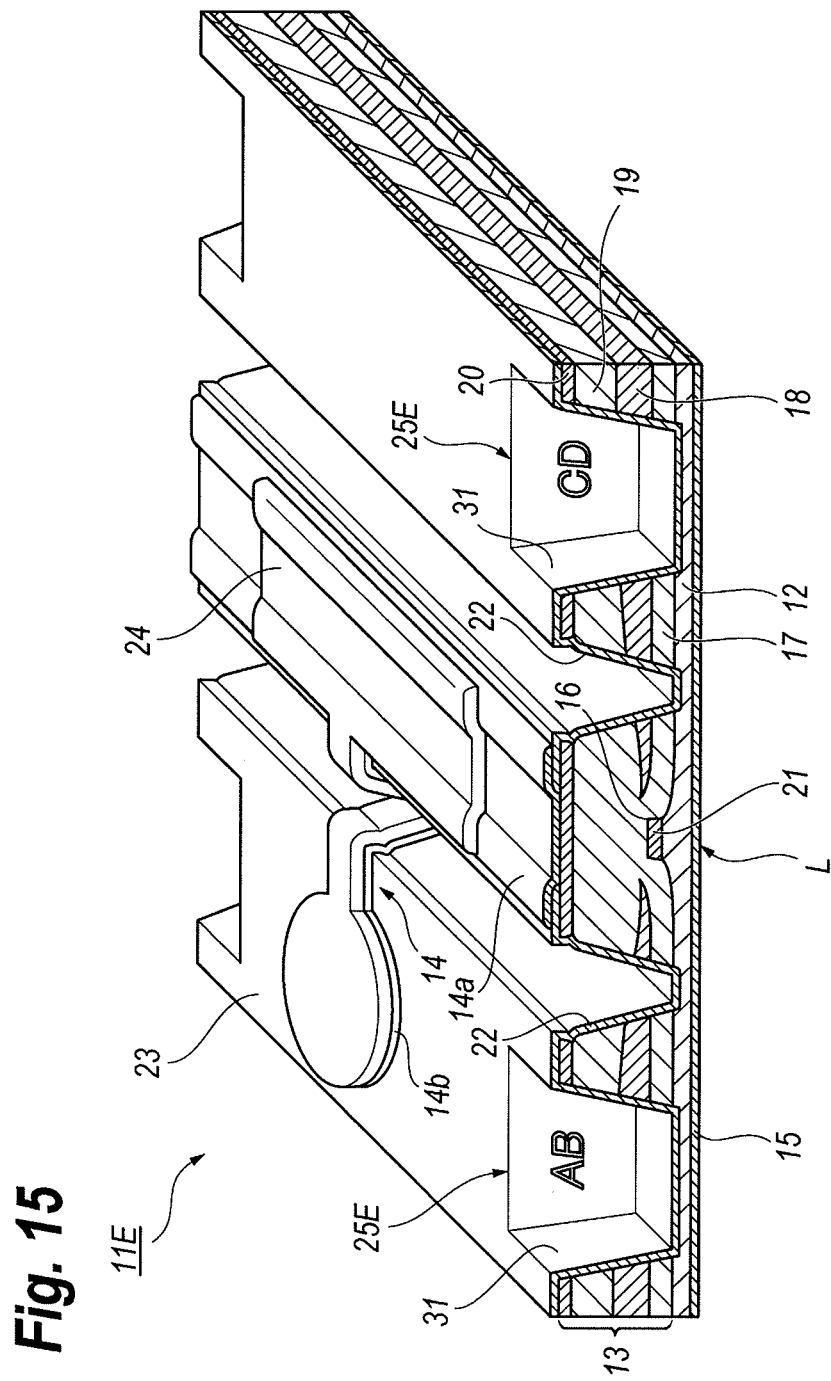

OPTICAL MODULE INSTALLING OPTICAL DEVICE WITH IDENTIFYING MARK VISUALLY INSPECTED AFTER ASSEMBLY THEREOF

BACKGROUND OF THE INVENTION

1. Field of the Invention

The present invention relates to an optical module that installs an optical module with an identifying mark that is able to be inspected even after the optical device is installed in the optical module.

2. Related Background Arts

The manufacturing of the optical module includes a process to cleave a semiconductor wafer to obtain so many numbers of device chips, to assemble respective device chips on a stem of the optical module and to enclose the device chip within a package by assembling the cap with the stem. The optical module thus assembled is installed within an optical transceiver as a transmitter optical subassembly (TOSA) or a receiver optical subassembly (ROSA).

Recent optical communication system has continuously requested further performance for the TOSA and the ROSA, which inevitably reduces the process margin and the yield of the optical device. Moreover, the optical device with an optical transmitting function, namely, a semiconductor laser diode generally shows a variation in the performance thereof after it is packaged. Therefore, it is necessary for the stability of the production of the optical module to distinguish the optical device, or the semiconductor chip even after the package enclosed the chip therein.

A PCT application internationally published as WO2000/057458 has disclosed a semiconductor device with information to identify the device, such as a number of the production lot, a number of wafers, and a position of the chip within the wafer. Such information is reflected in patterns formed on the top surface of the device chip to be inspected during the assembling process of the device chip. The information thus appeared in the device chip may be fed back to the wafer process to increase the process stability.

However, the identifying pattern disclosed in the prior art is formed on the top surface of the device chip, the pattern becomes unrecognizable after the device chip is enclosed within the CAN package. Therefore, additional information or a conversion table that relates the device chip within the CAN package to the wafer process is necessary, which complicates the management of the production.

SUMMARY OF THE INVENTION

One aspect of the present invention relates to an optical device that provides semiconductor layers on a semiconductor substrate. The semiconductor layers include an active layer that generates light along a direction parallel to the semiconductor layers, and a light-emitting facet that intersects the direction. The optical device of the present invention may provide an identifying mark to distinguish the optical device form other devices, and this identifying mark may be provided in a position able to be inspected from the direction. Because the optical device according to an embodiment thus provides the identifying mark, the optical device may be distinguished from other devices even when it is enclosed in the CAN package where only the light-emitting facet may be viewed from the outside of the package through the lens.

The optical device of the invention may provide trenches reaching the semiconductor substrate in both sides of the active layer, and the identifying mark may be positioned outside of the trench with respect to the active layer. The trench may suppress the stress caused in the formation of the identifying mark from affecting the active layer, which may enhance the reliability of the optical device.

The identifying mark of the invention may be a groove exposed in the light-emitting facet, and the counts and the positions of the groove may show the information regarding the device chip. The identifying mark may be patterns formed on the top of the semiconductor layers and the ends thereof are exposed in the light-emitting facet. The numbers and the positions of the patterns may show the information of the device chip. Further, the identifying mark may be a combination of the grooves and the patterns.

Another aspect of the present invention relates to an optical module that comprises an optical device with semiconductor layers on a semiconductor substrate and a CAN package with a stem and a cap. The semiconductor layers include an active layer that generates light along the direction parallel to the semiconductor layers, and a light-emitting facet intersecting the direction. The stem includes a stem block whose side surface mounts the optical device so as to come the semiconductor substrate in contact with the side surface and the light-emitting facet faces the lens secured in the cap.

Because the optical module of the present invention is thus configured, even the optical device is mounted in the side of the stem block, the identifying mark may be inspected from the outside of the optical module through the lens, which may enhance the productivity of the optical module, in particular, the traceability of the optical device and the information of the device chip may be easily fed back to the production of the optical device.

BRIEF DESCRIPTION OF THE DRAWINGS

The foregoing and other purposes, aspects and advantages will be better understood from the following detailed description of a preferred embodiment of the invention with reference to the drawings, in which:

FIG. 14 shows a primary portion of the manufacturing process for the optical device shown in FIG. 13;

FIG. 15 is a perspective view showing an optical device according to the fifth embodiment of the present invention;

DETAILED DESCRIPTION OF PREFERRED EMBODIMENTS

Next, some preferred embodiments of the present invention will be described as referring to accompanying drawings.

Figure 1:
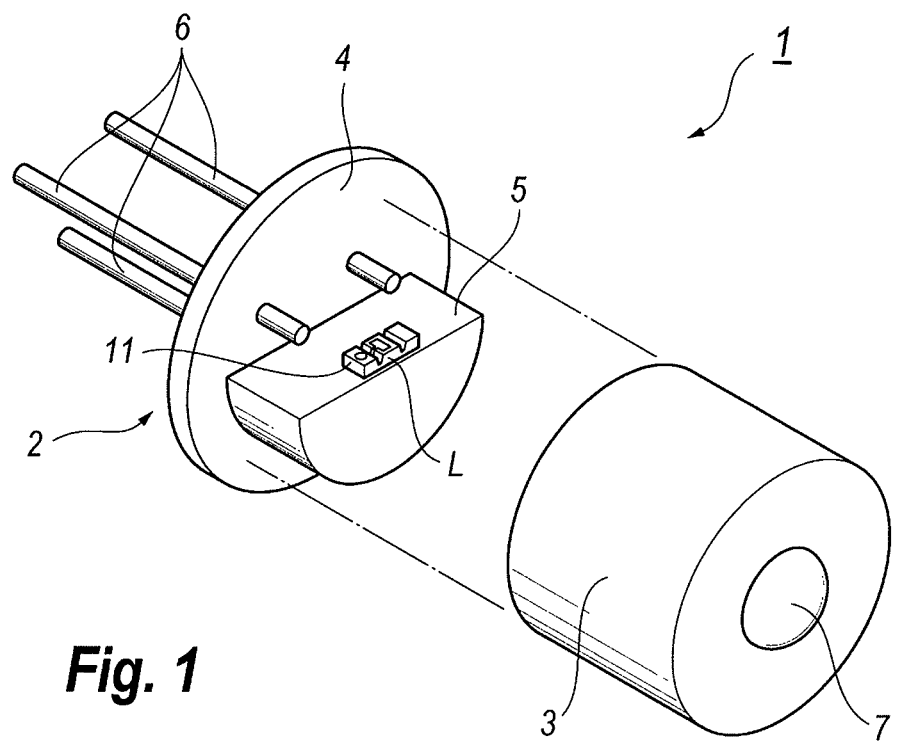
FIG. 1 is an exploded view of the optical module according to an embodiment of the present invention.

FIG. 1 is an exploded view showing an optical module according to an embodiment of the invention. The optical module 1 shown in FIG. 1 may be implemented within an optical transceiver as a transmitter optical subassembly (TOSA) and applicable to the high-speed communication system, for instance, the transmission speed of about 10 Gbps or higher, as an optical signal source. The optical module 1, as shown in FIG. 1, includes a co-axial package (CAN package) with a stem 2 and a cap 3 assembled with the stem 2, and a semiconductor optical device 11 installed in a space formed by the stem 2 and the cap 3.

The stem 2 includes a disk-shaped stem base 4, a stem block 5 protruding from the stem base 4 into the space, and a plurality of lead pins 6 passing through the stem base 4. These lead pins 6 are secured in the stem base 4 by, for instance, seal glass, such that a length of a top portion thereof extrudes into the inner space of the CAN package. The semiconductor optical device 11, which may be a type of the distributed feedback laser diode (DFB-LD) with a multiple quantum well (MQW) structure for the active layer thereof. The optical device 11 is mounted on the side of the stem block 5 so as to face the light-emitting facet L of the device 11 to the lens 7. The cathode of the optical device 11 is electrically coupled with one of the lead pins 6 with a conductive wire, while, the anode thereof is connected to the stem base 2 with the conductive wire and via-holes. The cap 3 is fixed to the stem base 4 so as to cover the stem block 5. In a center of the ceiling of the cap 3 is provided with a circular opening into which a spherical lens 7 is fit. This spherical lens 7 may concentrate light emitted from the facet L of the optical device 11 and guide the light outwardly.

Figure 2:
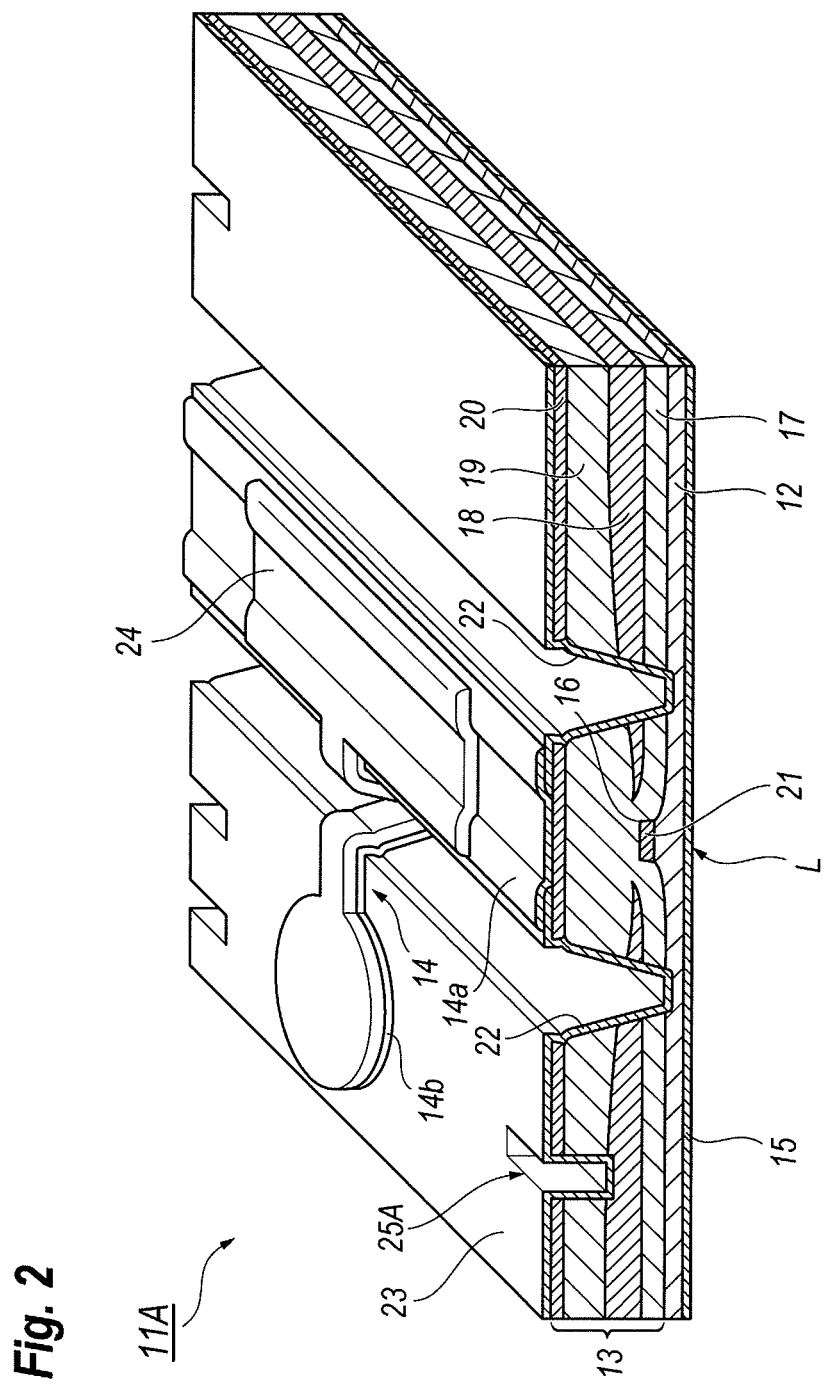
FIG. 2 is a perspective view of an optical device according to the first embodiment of the invention.

Next, a structure of the semiconductor optical device 11 will be further described. FIG. 2 is a perspective view of the optical device 11A according to the first embodiment of the invention, which shows a cross section of the semiconductor optical device 11A. The optical device 11A includes a semiconductor substrate 12, semiconductor layers 13 on the substrate 12, a surface electrode 14 on the surface of the layers 13, and a back electrode 15 on the other surface of the semiconductor substrate 12.

The semiconductor layers 13 includes a mesa 16, a first burying layer 17 that buries the mesa 16, a second burying layer 18 on the first burying layer 16, a cladding layer 19 on the mesa 16 and the second burying layer 18, and a contact layer 20 on the cladding layer 19. The semiconductor substrate 12 may be made of an n-type InP doped with tin (Sn) with a thickness thereof about 100 μm. The mesa 16 has a striped shape formed by an etching of the semiconductor layers 13 and includes an active layer 21. The active layer 21 may be made of GaInAsP with the MQW structure and have a separated optical confinement hetero-structure (SCH) layer. Between the SCH layer and the cladding layer 19 is formed with an optical grating whose light-guiding direction is aligned with the light-guiding direction of the active layer 21.

The active layer 21 may generate light, namely, photons by the recombination of carriers injected from the cladding layers 19 arranged so as to put the active layer therebetween. The optical grating may reflect a portion of light propagating in the active layer 21 toward an opposite direction, which may selectively feedback the light whose wavelength is determined by a period of the corrugated pattern of the optical grating.

The first burying layer 17 may be made of a p-type InP doped with zinc (Zn), while the second burying layer 18 may be made of an n-type InP doped with silicon (Si). The second burying layer 18 buries the mesa 16 to make the surface thereof planar. The cladding layer 19 may be a p-type InP doped with Zn similar to the first burying layer, where the cladding layer 19 may confine the light generated in the active layer 21. The contact layer 20 may be a p-type GaInAs doped with Zn, where the contact layer 20 provides an ohmic contact for the surface electrode 14.

Each side of the mesa 16 is provided with a trench 22 that has a depth from the contact layer 20 to the substrate 12 and extends from the light-emitting facet L to another facet. Moreover, the contact layer 20 provides on a surface thereof a protection layer 23 with a thickness of around 300 nm and made of $SiO_2$. The protection layer 20, which is sometimes called as the passivation layer, covers the contact layer 20 and the inner surface of the trench 22 except for an opening corresponding to the active layer 20.

The surface electrode 14 may be made of a layers of metals of titanium (Ti)/platinum (Pt)/gold (Au). The contact portion 14a of the electrode 14 comes in contact with the contact layer 20 exposed in the opening of the protection layer 23; while, the pad portion 14b of the electrode 14 is formed in an outside of the trench 22 with respect to the mesa 16 and has a circular plane shape. The contact portion 14a is connected with the pad portion 14b with an interconnection extending on the inner surface of the trench. On the top of the electrode 14 is covered with a metal plating 24 whose thickness is about 3 μm; while, the back electrode 15 may be made of eutectic metal of AuGe/Ni and is formed on the back surface of the semiconductor substrate 12.

Furthermore, the optical device 11A of the present embodiment may provide in the outside of the trench 22, an identifying mark 25A. Specifically, the identifying mark 25A of the present embodiment may be a groove extending from the contact layer 20 to the first burying layer 17, which is shallower than the trench 22. Because the identifying mark 25A is exposed in the light-emitting facet L, the mark 25A is distinguishable when it is viewed from the direction of the normal line of the light-emitting facet L.

Figure 3A:
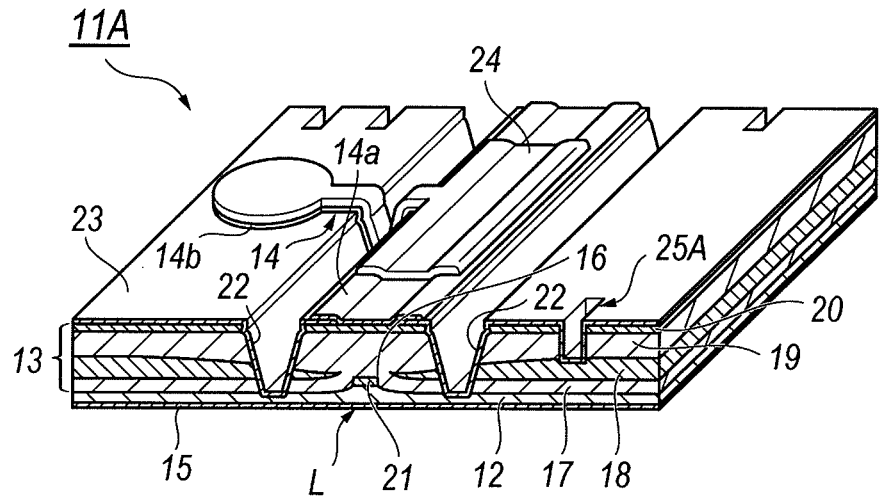
FIG. 3 shows an example of the identifying mark.
Figure 3B:
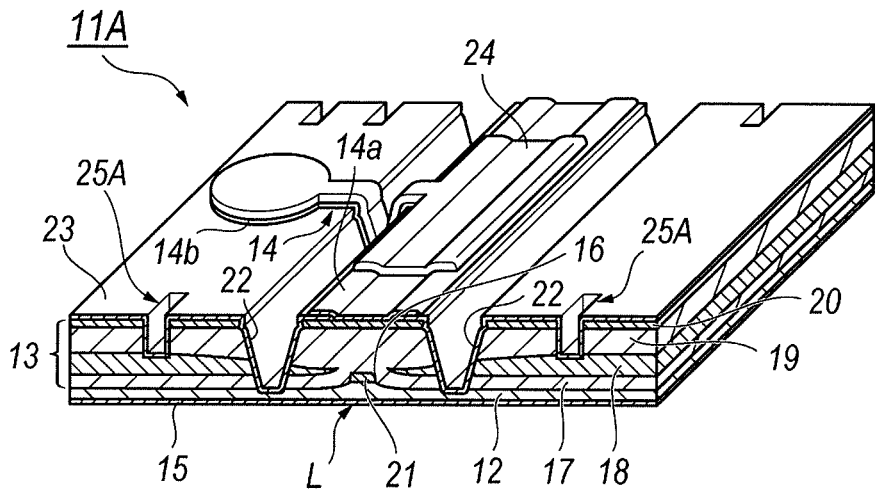

As they are illustrated in FIGS. 3A and 3B, the identifying mark 25A may be distinguishable by the positions and the counts thereof. Therefore, even when the optical device 11A is installed in the CAN package and the primary surface thereof where the surface electrode 14 is formed thereon is unable to be inspected from the direction along the axis of the optical device 11A; the optical device 11A may be distinguishable by identifying the mark by the positions and the counts thereof. The identifying mark of the optical device 11A may relate to a chip number within a semiconductor wafer; accordingly, the traceability of the manufacturing process reflecting in the device chip may be realized.

Figure 4A:
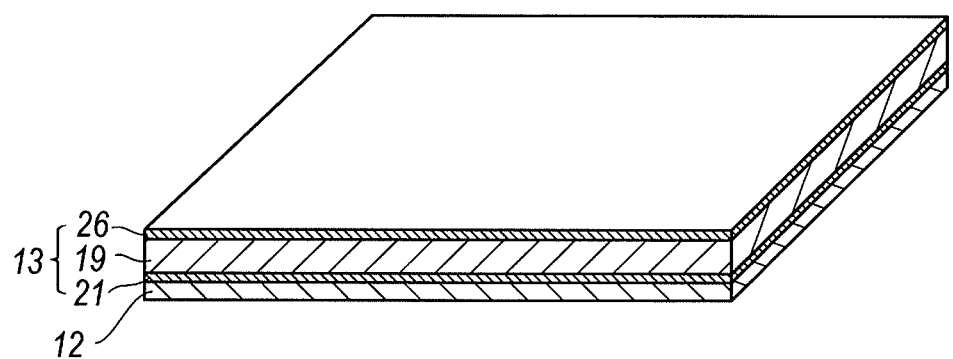
FIG. 4 shows a manufacturing process of the optical device shown in FIG. 2.

Next, a process for manufacturing the optical device 11A described above will be explained. First, a semiconductor substrate 12 shown in FIG. 4A is prepared. Then, semiconductor layers 13 are grown on a surface of the substrate 12 by the OMVPE (organic metal vapor phase epitaxy) technique, where the semiconductor layers 13 include the active layer 21, the cladding layer 19, and the cap layer 26 in this order from the side of the substrate 12. Between the active layer 21 and the cladding layer 19 is formed with a corrugation pattern for the optical grating by sequential processes of the electron beam exposure or the interference exposure and the etching.

Figure 4B:
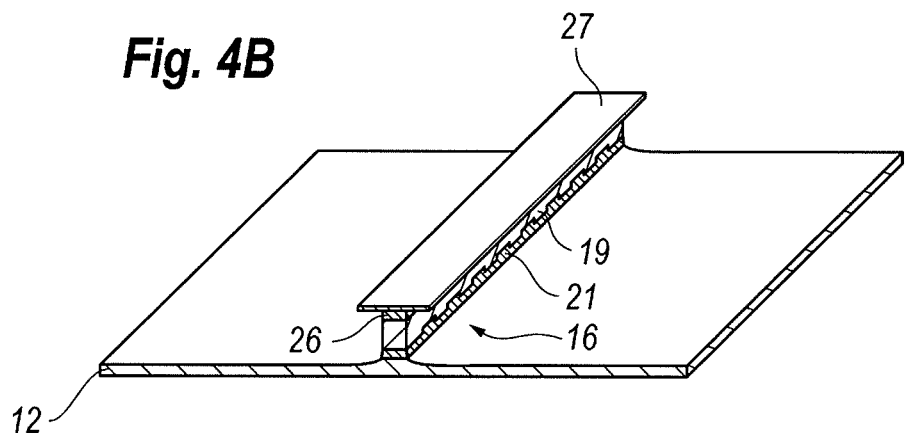

Next, the CVD (chemical vapor deposition) technique may form an inorganic film 27 such as silicon nitride (SiN) on the cap layer 26. Then a striped pattern for the mesa 16 with a width of about 3 µm is formed by the photo-lithography and the selective etching by the reactive ion etching (RIE) technique using carbon tetra-fluoride ($CH_4$) as a reaction gas may form the striped SiN film 27 shown in FIG. 4B. Removing the photo-resist by an organic solvent and a wet-etching using a brome-methanol ($BrCH_3$); the mesa 16 including the active layer 21, the cladding layer 19, and the cap layer 26 is obtained.

Figure 5A:
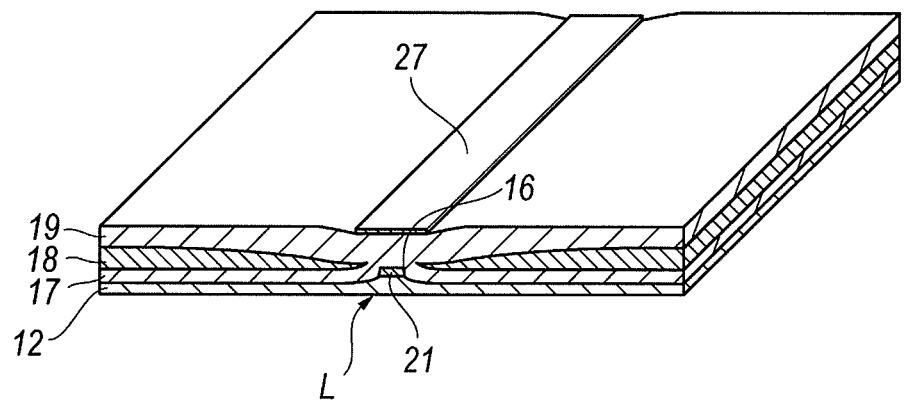
FIG. 5 shows a manufacturing process subsequent to the process shown in FIG. 4.
Figure 5B:
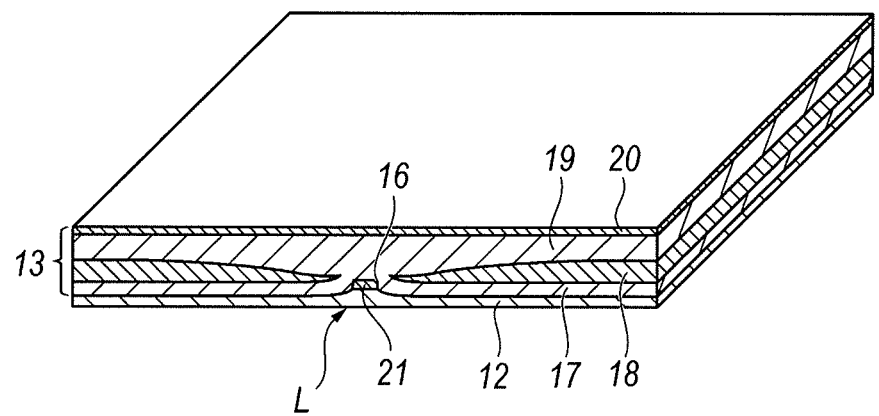

Subsequently, the OMVPE technique may grow, after the formation of the mesa 16, the first burying layer 17, the second burying layer 18, and an additional cladding layer 19, as shown in FIG. 5A. Removing the SiN film 27 by fluoric acid, the OMVPE further grows the additional cladding layer 19 so as to make the surface thereof planar; then grows the contact layer 20 on the cladding layer 19. The doping concentration of the cladding layer 19 which is additionally grown on the original cladding layer may have a doping concentration different from the original cladding layer grown in the processes shown in FIG. 4A or FIG. 5A.

Figure 6A:
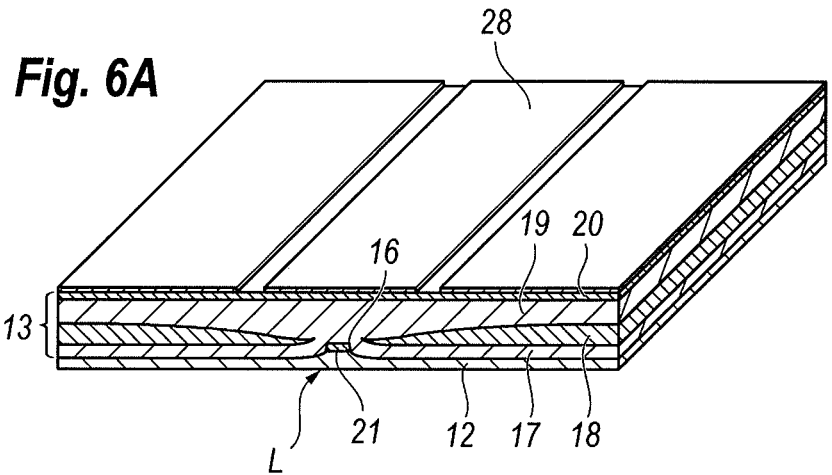
FIG. 6 shows a manufacturing process subsequent to the process shown in FIG. 5.
Figure 6B:
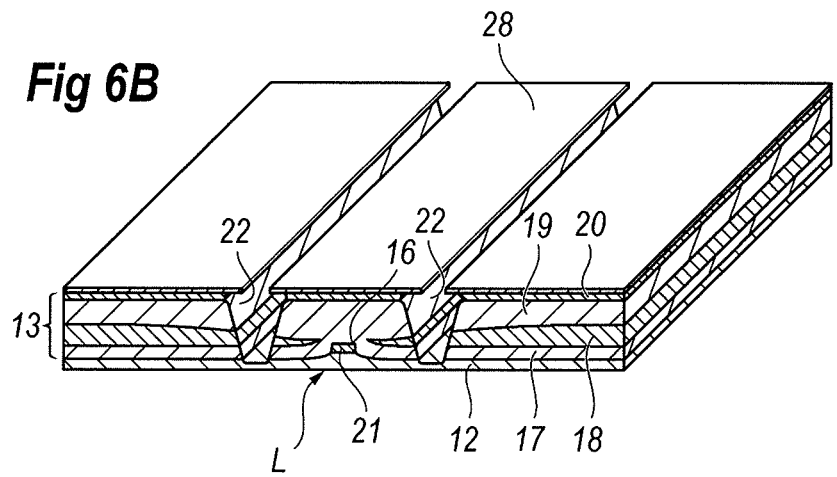
Figure 6C:
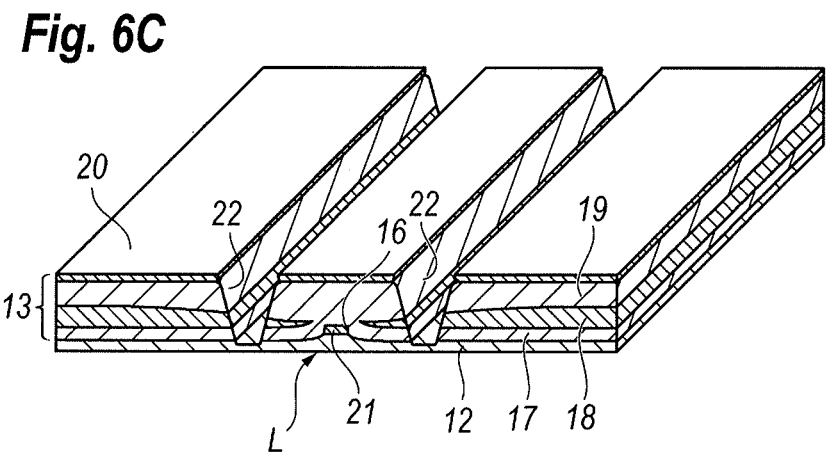

After the growth of the contact layer 20; the CVD technique may form the SiN layer 28 on the contact layer 20. Subsequently, a photo-resist pattern is formed, where the pattern has two eliminated regions with a width of about 10 µm in both sides of the mesa 16, and the SiN layer 28 beneath the photo-resist is patterned by the RIE technique. Thus, the SiN pattern 28 with two striped opening is formed. This patterned SiN layer 28 operates as an etching mask for the formation of the trench 22. Removing the photo-resist 28 and wet-etching the semiconductor layers using a mixture of hydrochloric acid (HCl), acetic acid ($CH_3COOH$) and hydrogen peroxide ($H_2O_2$), two trenches 22 may be formed in both sides of the mesa 16, as shown in FIG. 6B. The SiN pattern 28 may be removed after the formation of the trench 22 by fluoric acid (HF), as shown in FIG. 6C.

The process according to the present embodiment may further form the identifying mark. That is, subsequent to the formation of the trench 22, another SiN film 29 is formed so as to cover the contact layer 20 and the inner surface of the trench 22. The SiN film 29 is patterned by the photo-lithography and the subsequent dry etching of RIE. The pattern appeared in the SiN layer 29 may have a rectangular shape and extend to the neighbor chip so as to traverse a cleave line along which the chip shown in figures is divided, which may expose the identifying mark 25A in the light-emitting facet L even when the cleave line is displaced from the designed line. Although FIGS. 4A to 9B show the light-emitting facet L explicitly, the light-emitting facet L is not appeared until the optical device 11A is divided in respective chips.

Figure 7A:
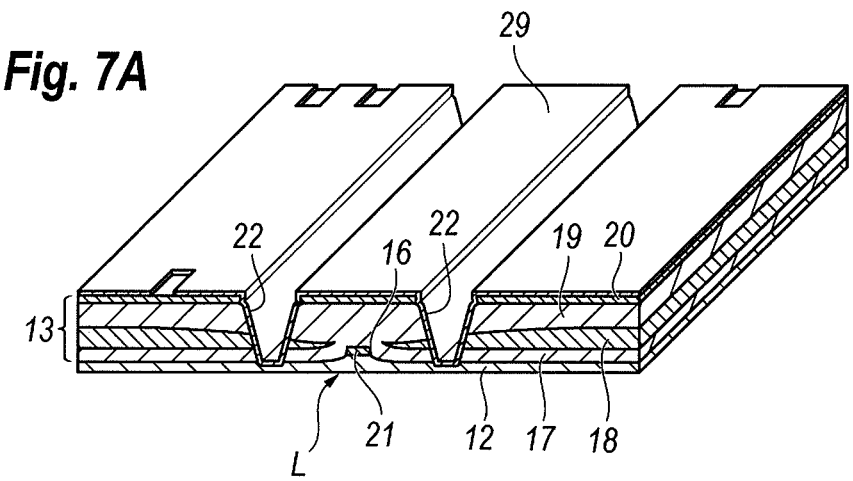
FIG. 7 shows a manufacturing process subsequent to the process shown in FIG. 6.
Figure 7B:
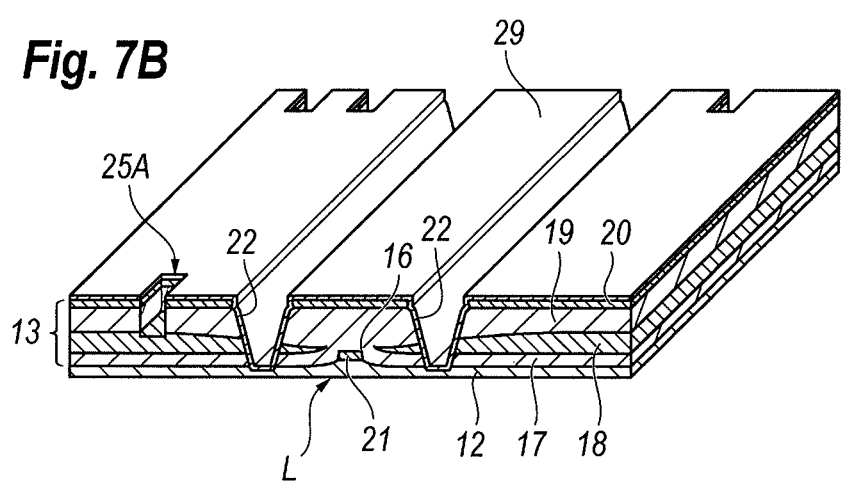
Figure 7C:
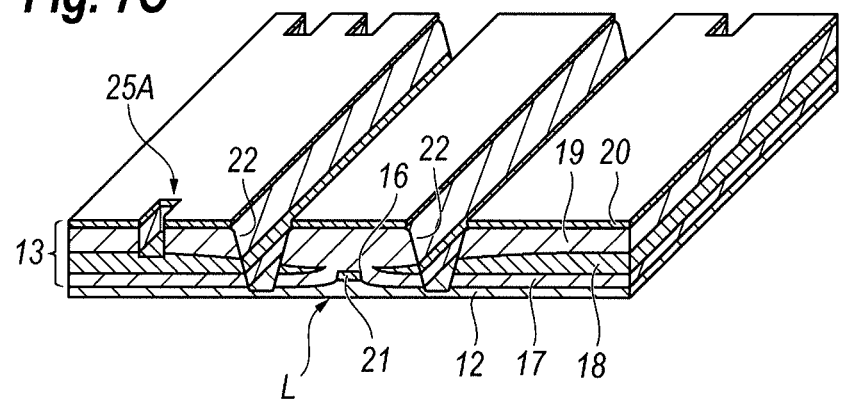

Patterning the SiN layer 29, the RIE technique using a mixture of $CH_4$ and $H_2$, as illustrated in FIG. 7A, the groove for the identifying mark 25A may be formed. After the formation of the groove, the SiN layer 29 may be removed by fluoric acid. In the formation of the groove for the identifying mark 25A, an iteration of the processes from that shown in FIG. 7A to that shown in FIG. 7C, the composite identifying mark may be obtained, where the groove has a specific depth depending on the position thereof.

Figure 8A:
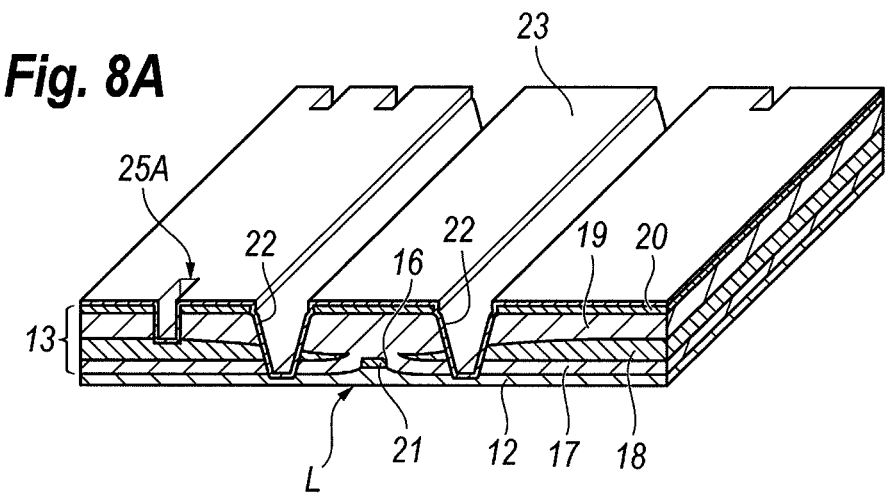
FIG. 8 shows a manufacturing process subsequent to the process shown in FIG. 7.
Figure 8B:
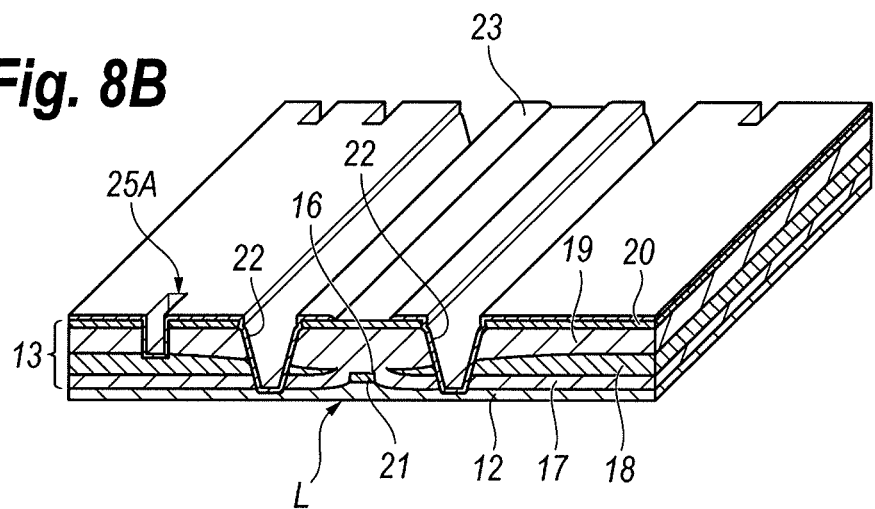
Figure 9A:
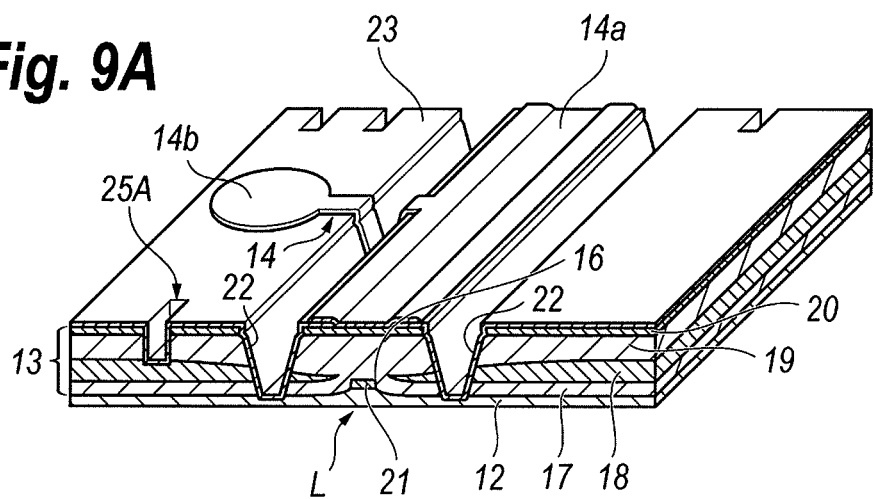
FIG. 9 shows a manufacturing process subsequent to the process shown in FIG. 8.
Figure 9B:
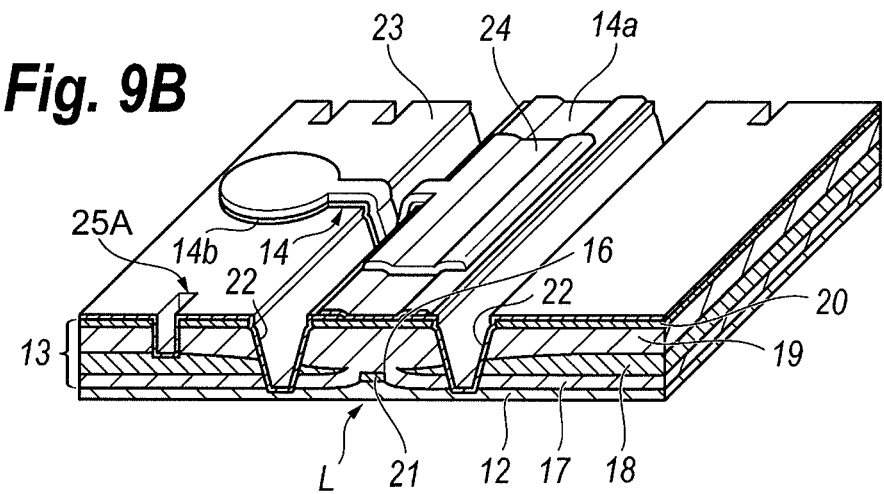

After the formation of the identifying mark 25A, the protection layer 23 is formed so as to cover the contact layer 20, the inside of the trench 22, and the inside of the identifying mark 25A, as shown in FIG. 8A; then, the striped opening with a width of about 4 µm is formed in a position corresponding to the active layer 21 in the mesa 16, FIG. 8B. The surface electrode 14 is subsequently formed by the metal evaporation or the sputtering, FIG. 9A; and a portion 24 of the surface electrode 14 is plated in thick with a gold (Au), FIG. 9B. Finally, the back electrode is formed in the back side of the semiconductor substrate 12; thus, the optical device 11A according to the present embodiment is completed.

The optical device 11A, as described above, provides the identifying mark 25A exposed in the light-emitting facet L, which enables the identifying mark to inspect from the outside of the package through the lens 7 even the optical device 11A is installed on the side of the stem block 5 in the edge-emitting arrangement and covered with cap 3. Because the identifying mark 25A may be in connection with the semiconductor wafer and the chip location within the wafer, it becomes unnecessary to identify the optical device 11A again, or to prepare a conversion table linking the optical module 1 with the optical device 11A after the assembly of the cap 3, which greatly simplifies the manufacturing process.

In the optical device 11A according to the present embodiment, the groove formed along the layers 13 of the semiconductor layers operates as the identifying mark 25A, and this groove is exposed in the light-emitting facet L, which enhances the inspection of the mark 25A through the spherical lens 7. Furthermore, the groove is easily arranged in the shape, the number and the position thereof, which may distinguish respective chips of the optical device 11A in the semiconductor wafer.

The identifying mark 25A is formed in the outer side of the trench 22 with respect to the active layer 21, that is, the active layer 21 is independent of the groove for the identifying mark 25A by the existence of the trench 22, which may suppress the stress caused by the formation of the groove from affecting the active layer 21.

Figure 10:
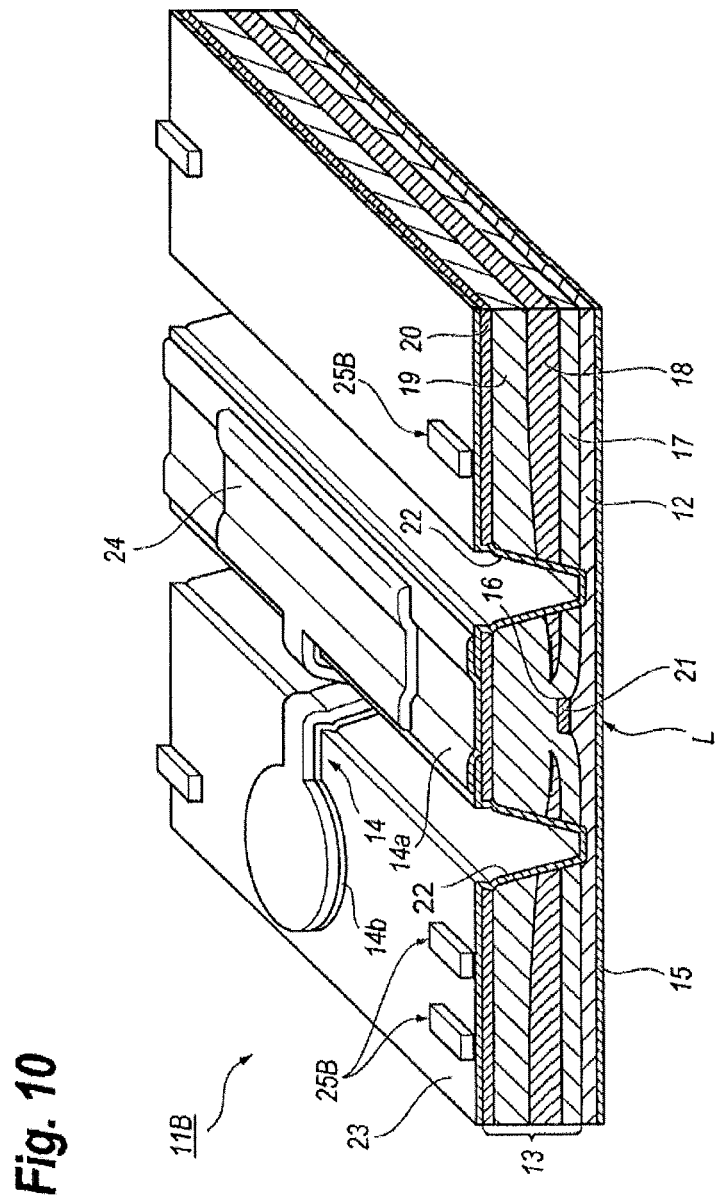
FIG. 10 is a perspective view showing another optical device according to another embodiment of the present invention, which is modified from the optical device shown in FIG. 2.

Although the embodiment described above provides the groove as the identifying mark 25A, the arrangement of the mark is not restricted to those grooves. Any distinguishable pattern viewed from the normal line of the light-emitting facet L may be applicable to the identifying mark 25A. For instance, an optical device 11B illustrated in FIG. 10 provides patterns made of resin such as benzo-cyclo-butane (BCB) on the top surface of the protection layer 23 in the outside of the trench 22 as the identifying mark 25B. The patterns are exposed in the light-emitting facet L of the device 11B.

Figure 11:
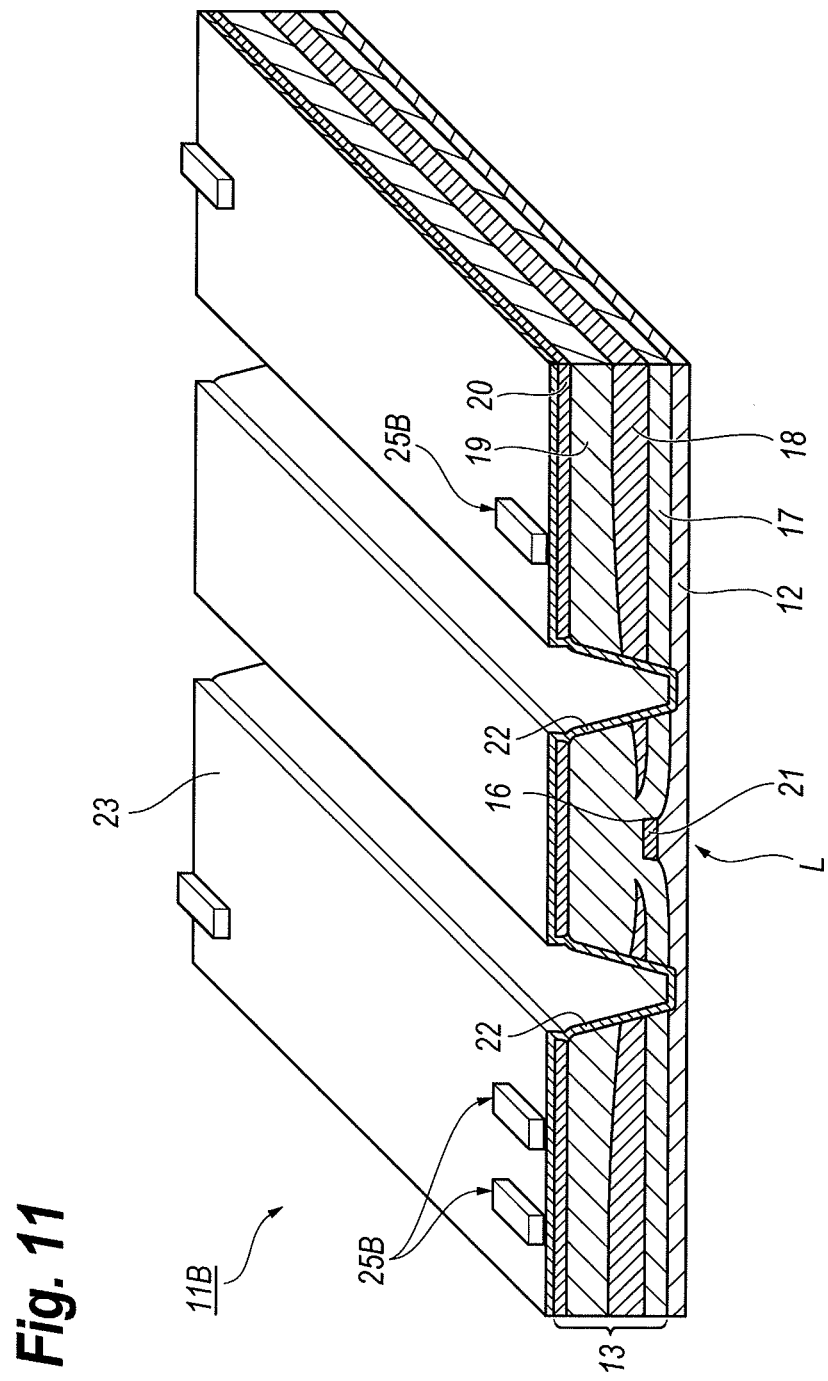
FIG. 11 shows a manufacturing process of the optical device shown in FIG. 10.
Figure 12:
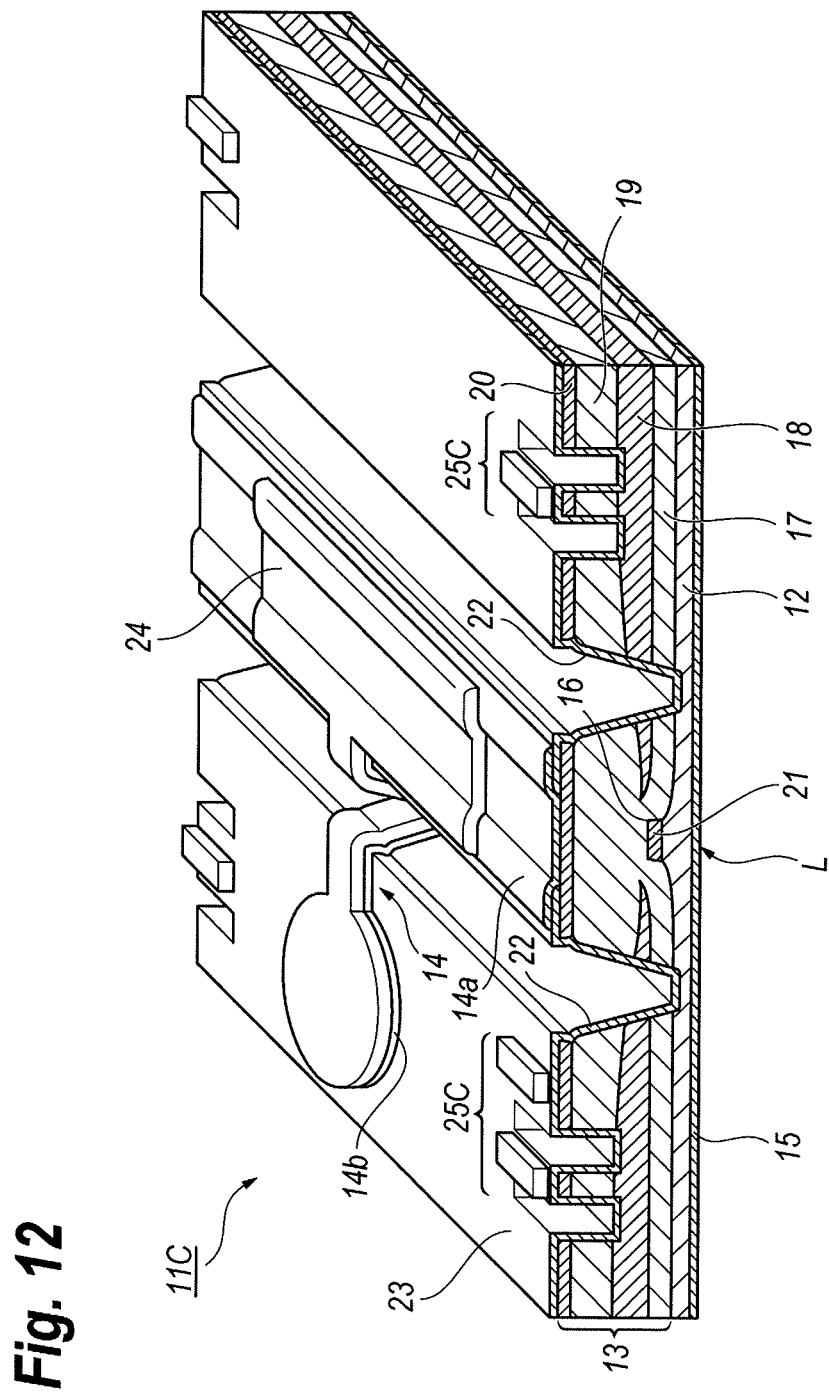
FIG. 12 is a perspective view showing still another optical device according to the third embodiment of the present invention.

A process to form such patterns is carried out by: forming the protection layer 23 so as to cover the contact layer 20 and the trench 22, and patterning the resin 25B by the exposure of the spin-coated resin film before the formation of the opening in the protection layer 23, as shown in FIG. 11. A combination of the grooves 25A and the patterns 25B may be used as the identifying mark 25C as shown in FIG. 12. Such composite mark 25C may enhance the discrimination degree of the optical device 11C.

Figure 13:
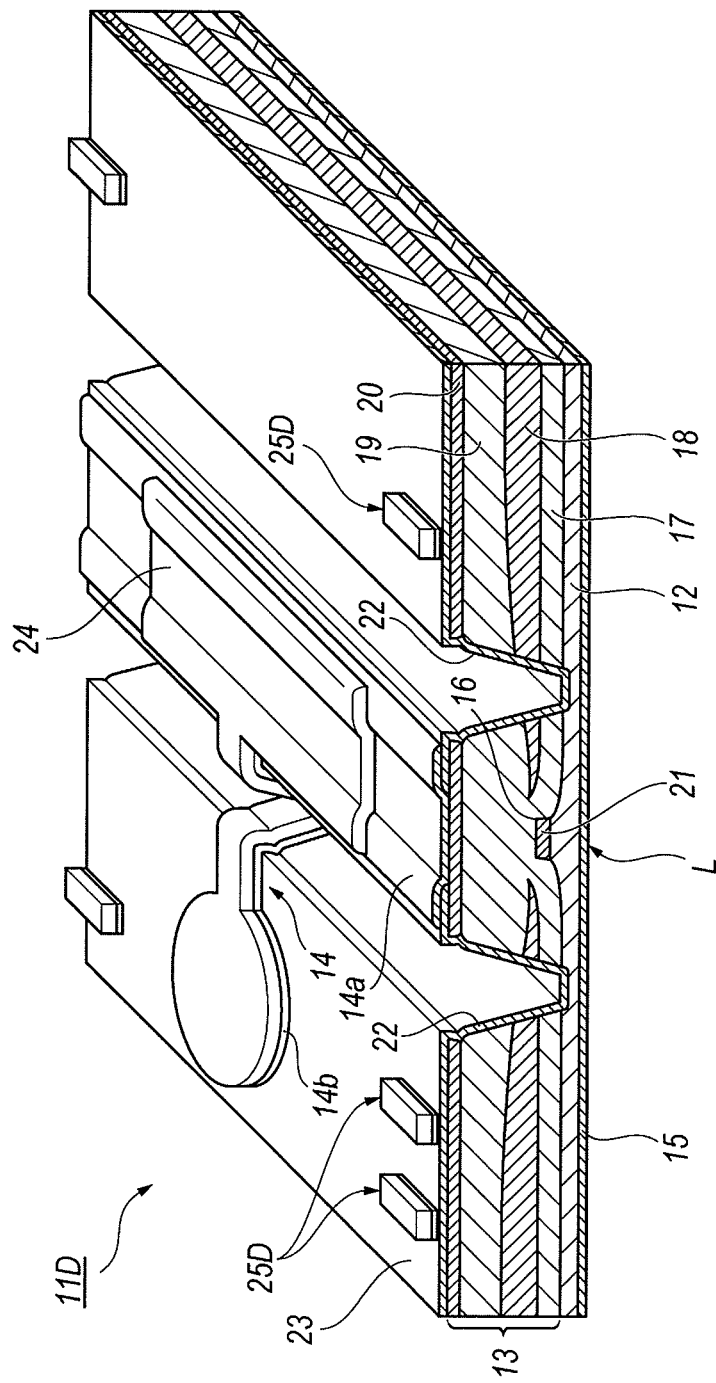
FIG. 13 is a perspective view showing an optical device according to the forth embodiment of the present invention.

FIG. 13 shows another embodiment of the optical device 11D with an identifying mark 25D. The identifying mark 25D in the present embodiment has a structure same as that of the pad portion 14b of the surface electrode 14, namely, a plated metal on the metal layers of Ti/Pt/Au. The identifying mark 25D may be formed by: patterning the identifying mark at the same time with the patterning of the surface electrode 14, and plating the mark 25D also at the same time with the plating of the surface electrode 14 (FIG. 14). The identifying mark may be a combination of the groove, the pattern made of resin, and the pattern of the plated metal.

FIG. 15 shows still another embodiment of the optical device 11E with an arrangement of the identifying mark 25E. The optical device 11E provides a groove 31 with a relatively greater width in the outside of the trench 22 and the identifying mark 25E formed in the side wall of the wider groove 31. This wider groove 31 has a depth shallower than the depth of the trench 22 and the side wall, where the identifying mark 25E is formed, is inclined with respect to the top surface of the protection layer 23 but substantially in parallel with the light-emitting facet L.

Figure 16A:
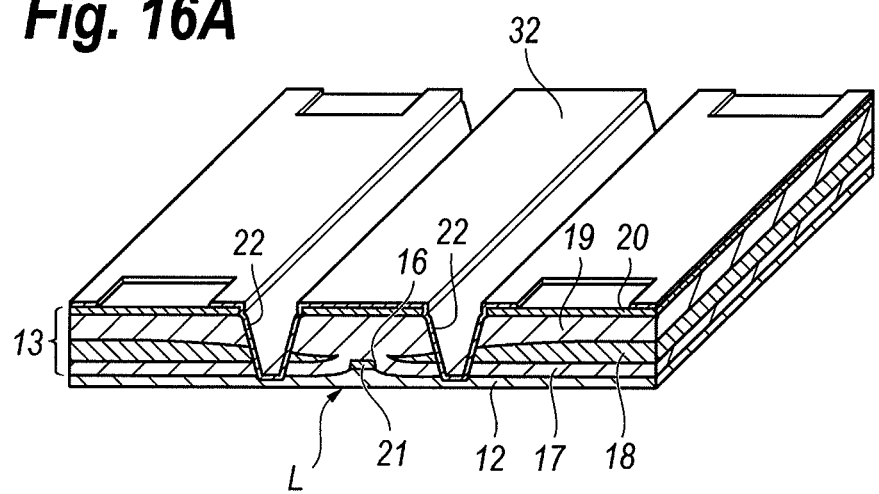
FIG. 16 shows a primary process for the optical device shown in FIG. 15.
Figure 16B:
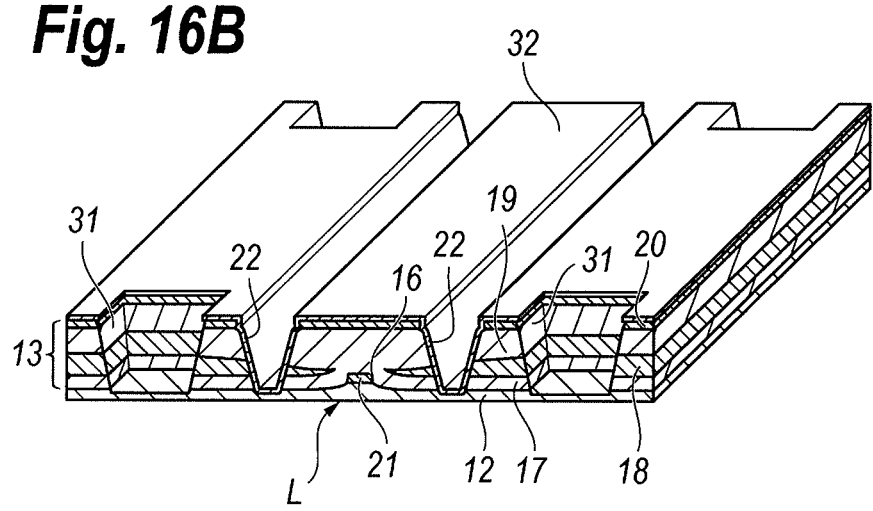
Figure 17A:
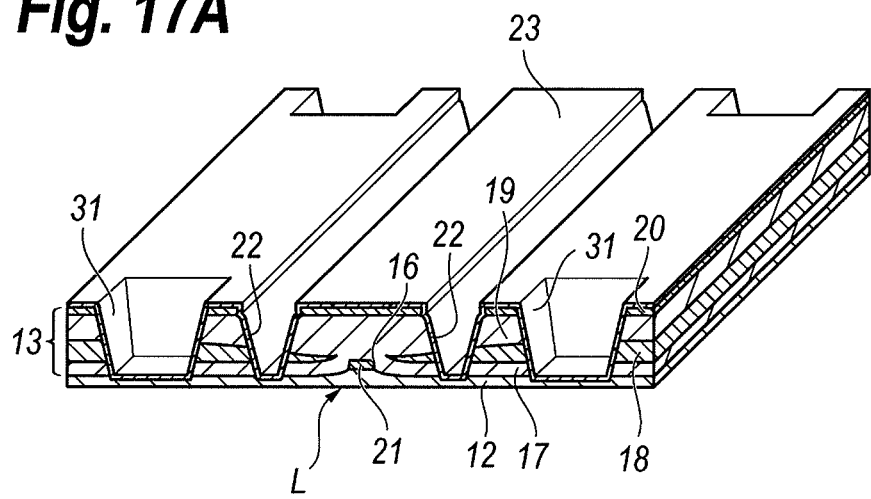
FIG. 17 shows a manufacturing process subsequent to the process shown in FIG. 16
Figure 17B:
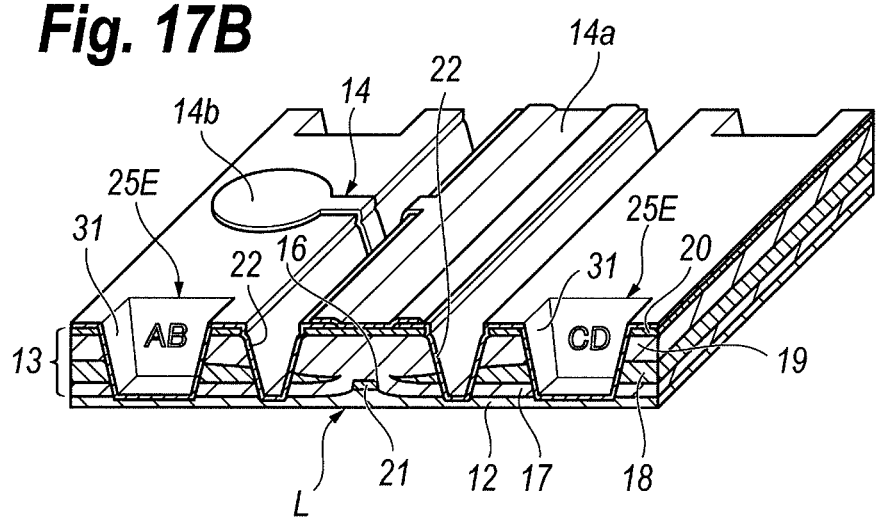

The process to form such a wider groove 31, or to form the identifying mark 25E is: forming the layer 32 made of SiN so as to cover the contact layer 20 and the trench 22 after the formation of the trench 22, and opening the SiN layer 32 in a position where the wider groove 31 is to be formed by the photo-lithography and the dry-etching, which prepares the mask layer 32 for the wider groove 31 (FIG. 16A). Then, a wet-etching for the semiconductor layers 13 using a mixture of hydrochloric acid, acetic acid and hydrogen peroxide may form the wider groove 31 (FIG. 16B). Removing the mask layer 32 by fluoric acid, forming the protection layer 23 on the whole surface of the optical device 11E, and forming and patterning the surface electrode 14, the optical device 11E may be completed, as shown in FIG. 17B. The identifying mark 25E on the side wall of the wider groove may be formed in the same process with the formation of the surface electrode 14.

The identifying mark 25E provided in the side wall of the wider groove 31 may be distinguishable through the spherical lens 7 even after the optical device is mounted within the package. Thus, the optical module 1 that mounts one of the optical devices, 11A to 11E, makes it possible to distinguish the optical device therein even after the optical device is mounted on the side of the stem block 5 and the cap 3 is assembled with the stem 2, which is unnecessary to distinguish the optical module 1 by an additional identification related to the original number, thus, the production control of the optical module 1 may be simplified.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

I claim:

1. An optical module, comprising:
    an optical device with semiconductor layers on a semiconductor substrate, said semiconductor layers including an active layer and a light-emitting facet, said active layer generating light along a direction parallel to said semiconductor layers, said light-emitting facet intersecting said direction; and
    a CAN package including a stem with a stem block and a cap with a lens, said optical device being mounted on a side surface of said stem block so as to face said light-emitting facet to said lens, wherein
    said optical device provides an identifying mark that distinguishes said optical device from other optical devices in a position able to be inspected from outside of said CAN package through said lens,
    said optical device provides a trench on each side of said active layer, said identifying mark being formed outside of at least one of said trenches with respect to said active layer, and
    said trenches reach said semiconductor substrate.

2. An optical device with semiconductor layers on a semiconductor substrate, said semiconductor layers including an active layer that generates light along a direction parallel to said semiconductor layers and a light-emitting facet intersecting said direction, wherein
    said optical device provides an identifying mark that distinguishes said optical device from other optical devices in a position able to be inspected from said direction, and
    said identifying mark is a plated metal formed on a top surface of said semiconductor layers and exposed in said light-emitting facet.

3. An optical device with semiconductor layers on a semiconductor substrate, said semiconductor layers including an active layer that generates light along a direction parallel to said semiconductor layers and a light-emitting facet intersecting said direction, wherein
    said optical device provides an identifying mark that distinguishes said optical device from other optical devices in a position able to be inspected from said direction, and
    said identifying mark is a pattern provided in a side of a groove exposed in said light-emitting facet.

4. An optical device with semiconductor layers on a semiconductor substrate, said semiconductor layers including an active layer that generates light along a direction parallel to said semiconductor layers and a light-emitting facet intersecting said direction, wherein
    said optical device provides an identifying mark that distinguishes said optical device from other optical devices in a position able to be inspected from said direction,
    said optical device provides a trench on each side of said active layer, said identifying mark being formed outside of at least one of said trenches with respect to said active layer,
    said trenches reach said semiconductor substrate, and
    said identifying mark is provided in said light-emitting facet of said optical device.

5. The optical device of claim 4, wherein said identifying mark comprises a plated metal formed on a top surface of said semiconductor layers and exposed in said light-emitting facet.

6. The optical device of claim 4, wherein said identifying mark comprises a pattern provided in a side of a groove exposed in said light-emitting facet.

7. The optical device of claim 4, wherein said identifying mark is a groove formed in said light-emitting facet.

8. The optical device of claim 7, wherein said groove is shallower than a depth of said trenches.

9. The optical device of claim 4, wherein said identifying mark comprises a pattern formed on a top surface of said semiconductor layers and exposed in said light-emitting facet.

10. The optical device of claim 9, wherein said pattern is made of resin.

* * * * *